US 9,041,089 B2

(12) United States Patent
Chen et al.

(10) Patent No.: US 9,041,089 B2
(45) Date of Patent: May 26, 2015

(54) NONVOLATILE MEMORY STRUCTURE

(71) Applicant: eMemory Technology Inc., Hsin-Chu (TW)

(72) Inventors: Chih-Hsin Chen, Changhua County (TW); Wei-Ren Chen, Pingtung County (TW); Tsung-Mu Lai, Hsinchu County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 14/141,428

(22) Filed: Dec. 27, 2013

(65) Prior Publication Data

US 2014/0361358 A1    Dec. 11, 2014

Related U.S. Application Data

(60) Provisional application No. 61/832,152, filed on Jun. 7, 2013.

(51) Int. Cl.
*H01L 29/788*    (2006.01)
*H01L 27/115*    (2006.01)

(52) U.S. Cl.
CPC .................. *H01L 27/11524* (2013.01)

(58) Field of Classification Search
CPC ......... G11C 16/14; G11C 16/26; G11C 16/12
USPC ...................... 257/315, 298, 316; 365/185.14
See application file for complete search history.

(56) References Cited

U.S. PATENT DOCUMENTS

| 8,000,139 | B2 * | 8/2011 | Kalnitsky et al. | ........ 365/185.06 |
| 8,264,039 | B2 * | 9/2012 | Wang et al. | .................. 257/339 |
| 8,320,180 | B2 * | 11/2012 | Kalnitsky et al. | ........ 365/185.16 |
| 8,477,539 | B2 * | 7/2013 | Chang et al. | ............. 365/185.26 |
| 2007/0145467 | A1 * | 6/2007 | Park et al. | ...................... 257/315 |
| 2008/0251832 | A1 * | 10/2008 | Chih et al. | ...................... 257/315 |
| 2012/0236646 | A1 * | 9/2012 | Hsu et al. | ................. 365/185.14 |

FOREIGN PATENT DOCUMENTS

| JP | H0237778 A | 2/1990 |
| JP | 2006344735 A | 12/2006 |
| JP | 200981181 A | 4/2009 |
| JP | 2010283110 A | 12/2010 |
| JP | 2013102119 A | 5/2013 |

* cited by examiner

*Primary Examiner* — Kyoung Lee
*Assistant Examiner* — Chi-Hua Yang
(74) *Attorney, Agent, or Firm* — Winston Hsu; Scott Margo

(57) ABSTRACT

A nonvolatile memory structure includes a substrate having thereon a first, a second, and a third OD regions arranged in a row. The first, second, and third OD regions are separated from one another by an isolation region. The isolation region includes a first intervening isolation region between the first OD region and the second OD region, and a second intervening isolation region between the second the third OD region. A first select transistor is formed on the first OD region. A floating gate transistor is formed on the second OD region. The floating gate transistor is serially coupled to the first select transistor. The floating gate transistor includes a floating gate completely overlapped with the second OD region and is partially overlapped with the first and second intervening isolation regions. A second select transistor is on the third OD region and serially coupled to the floating gate transistor.

26 Claims, 12 Drawing Sheets

| Mode | CL | EL | WL | SG | BL | SL | PSUB |
|------|-----|-----|-----|-----|-----|-----|------|
| PGM | VPP | VPP | VDD | VSS | VSS | VSS | VSS |
| ERS | VSS | VPP | VDD | VSS | VSS | VSS | VSS |
| Read | VRD | VRD | VDD | VDD | VBL | VSS | VSS |

$|VSS| \leq |VDD| \leq |VPP|$
$|VSS| \leq |VBL| \leq |VPP|$
$|VSS| \leq |VRD| \leq |VPP|$

FIG. 2B

| Mode | EL | WL | SG | BL | SL | PL | PSUB |
|------|-----|-----|-----|----------|-----|-----|------|
| PGM  | VPP | VDD | VDD | Floating | VPP | VSS | VSS  |
| ERS  | VPP | VDD | VSS | VSS      | VSS | VSS | VSS  |
| Read | VRD | VDD | VSS | VBL      | VSS | VRD | VSS  |

|VSS|≦|VDD|≦|VPP|
|VSS|≦|VBL|≦|VPP|
|VSS|≦|VRD|≦|VPP|

FIG. 4B

NONVOLATILE MEMORY STRUCTURE

CROSS REFERENCE TO RELATED APPLICATIONS

This application claims priority from U.S. provisional application No. 61/832,152 filed Jun. 7, 2013, which is incorporated herein by reference in its entirety.

BACKGROUND OF THE INVENTION

1. Field of the Invention

The present invention relates generally to the filed of non-volatile memory devices. More particularly, the present invention relates to a nonvolatile memory structure with improved data retention.

2. Description of the Prior Art

Non-volatile memory (NVM) is a type of memory that retains information it stores even when no power is supplied to memory blocks thereof. Some examples include magnetic devices, optical discs, flash memory, and other semiconductor-based memory topologies. According to the programming times limit, non-volatile memory devices are divided into multi-time programmable (MTP) memory and one-time programmable (OTP) memory. MTP is multi-readable and multi-writable. For example, EEPROM and flash memory are designedly equipped with some corresponding electric circuits to support different operations such as programming, erasing and reading. OTP functions perfectly with electric circuits with mere programming and reading functions. Electric circuits for erasing operation are not required. Therefore, the electric circuits for OTP are much simpler than those for the MTP to minimize the production procedures and cost.

MTP memory units and OTP memory units share similar stacking structures. Structurally speaking, current floating gate NVMs are divided into double-poly non-volatile memory and single-poly non-volatile memory. In the double-poly non-volatile memory, it usually comprises a floating gate for the storage of charges, an insulation layer (an ONO composite layer of silicon oxide/silicon nitride/silicon oxide for example), and a control gate for controlling the access of data. The operation of the memory unit is based on the principle of electric capacity, i.e. induced charges are stored in the floating gate to change the threshold voltage of the memory unit for determining the data status of "0" and "1." Because the single-poly non-volatile memory is compatible with regular CMOS process, it is usually applied in the field of embedded memory, embedded non-volatile memory in the mixed-mode circuits and micro-controllers (such as System on Chip, SOC) for example.

For advance node consideration, as dimensions and tunneling oxide of the memory cell unit continue to shrink, the data retention loss or charge leakage from the floating gate looms as an increasingly serious problem. Therefore, there is a strong need in this industry to improve the data retention characteristics of the nonvolatile memory.

SUMMARY OF THE INVENTION

It is one objective of the invention to provide an improved nonvolatile memory structure with improved data retention, which is also compatible with the standard logic CMOS processes.

According to one embodiment of the invention, a nonvolatile memory structure includes a semiconductor substrate of a first conductivity type having thereon a first oxide define (OD) region, a second OD region and a third OD region arranged in a row along a first direction, wherein the first, second, and third OD regions are separated from one another by an isolation region, and wherein the isolation region comprises a first intervening isolation region between the first OD region and the second OD region, and a second intervening isolation region between the second OD region and the third OD region. A first select transistor is disposed on the first OD region. The first select transistor comprises a select gate extending along a second direction. A floating gate transistor is disposed on the second OD region. The floating gate transistor is serially coupled to the first select transistor, and wherein the floating gate transistor comprises a floating gate that is completely overlapped with the underlying second OD region and is partially overlapped with the first and second intervening isolation regions. A second select transistor is disposed on the third OD region serially coupled to the floating gate transistor. The second select transistor comprises a word line extending along the second direction.

According to one embodiment of the invention, a nonvolatile memory structure includes a semiconductor substrate of a first conductivity type having thereon a first oxide define (OD) region, a second OD region, a third OD region, a fourth OD region and a fifth OD region, wherein the first OD region, the second OD region, and the third OD region are arranged in a row along a first direction, while the second OD region, the fourth OD region, and the fifth OD region are arranged in a column along a second direction, wherein the first, second, and third OD regions are separated from one another by an isolation region, and wherein the isolation region comprises a first intervening isolation region between the first OD region and the second OD region, a second intervening isolation region between the second OD region and the third OD region, a third intervening isolation region between the second OD region and the fourth OD region, and a fourth intervening isolation region between the fourth OD region and the fifth OD region. A first select transistor is disposed on the first OD region. The first select transistor comprises a select gate extending along the second direction. A floating gate transistor is disposed on the second OD region. The floating gate transistor is serially coupled to the first select transistor, and wherein the floating gate transistor comprises a floating gate that is completely overlapped with the underlying second OD region, the fourth OD region, the fifth OD region, the third intervening isolation region and the fourth intervening isolation region, and is partially overlapped with the first and second intervening isolation regions. A sixth OD region is juxtaposed to the fourth OD region. The sixth OD region is not overlapped with the floating gate. A second select transistor coupled a word line is disposed on the sixth OD region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGS. 2A and 2B illustrate the equivalent circuit and exemplary operation conditions for programming (PGM), reading (READ) or erasing (ERS) operations of the memory cell unit as set forth in FIG. 1A;

FIGS. 3A-3E are schematic diagrams demonstrating a single-poly, nonvolatile memory cell unit in accordance with another embodiment of this invention, wherein FIG. 3A is a schematic plan view of a layout of the nonvolatile memory cell unit, FIG. 3B is a schematic, cross-sectional diagram taken along line I-I' of FIG. 3A, FIG. 3C is a schematic, cross-sectional diagram taken along line II-II' of FIG. 3A, FIG. 3D is a schematic, cross-sectional diagram taken along line III-III' of FIG. 3A, and FIG. 3E is a schematic, cross-sectional diagram taken along line IV-IV' of FIG. 3A; and FIGS. 4A and 4B illustrate the equivalent circuit and exemplary operation conditions for programming (PGM), reading (READ) or erasing (ERS) operations of the memory cell unit as set forth in FIG. 3A.

Figure 1A:
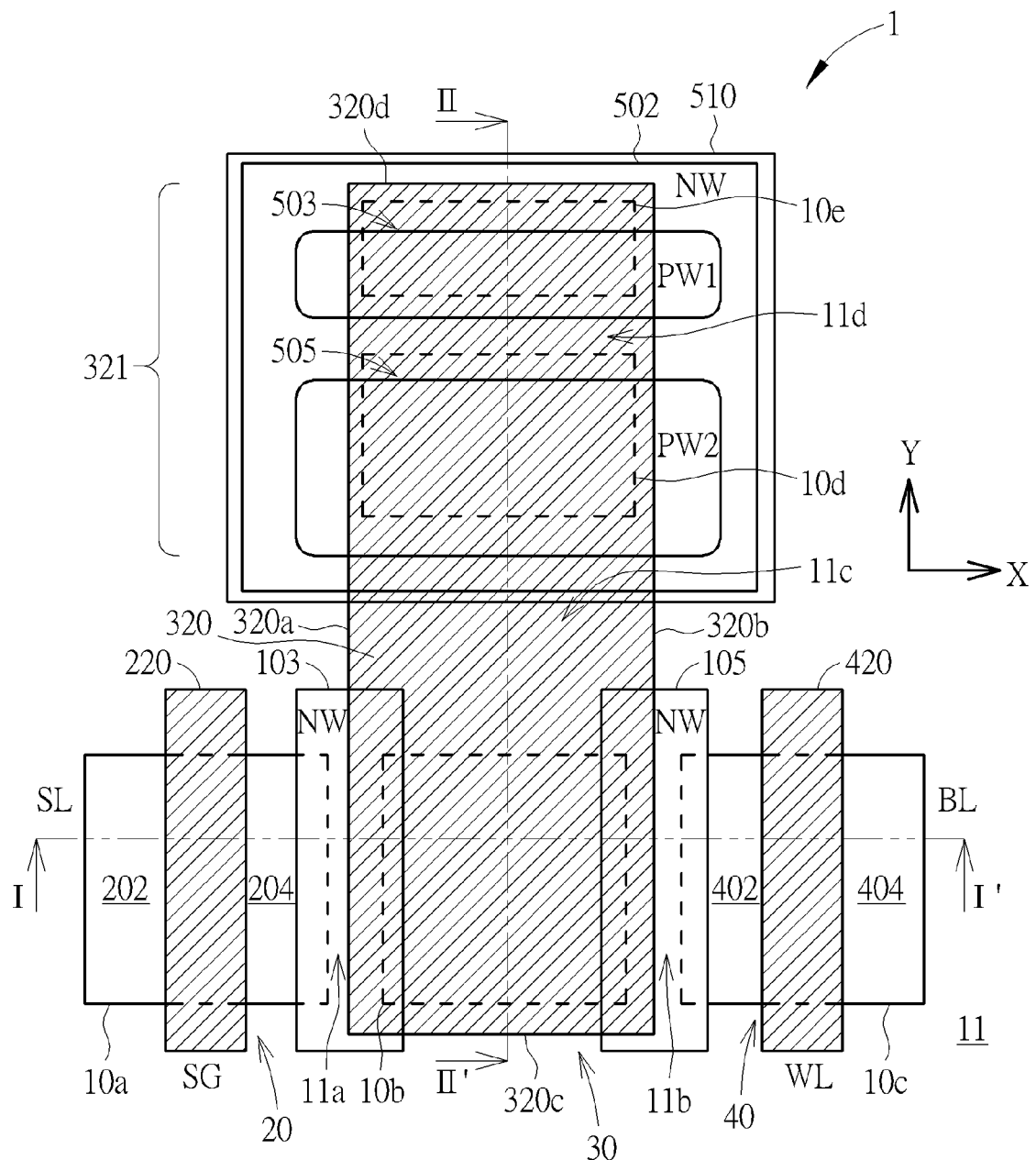
FIG. 1A is a schematic plan view of a layout of a single-poly, nonvolatile memory cell unit in accordance with one embodiment of this invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some system configurations and process steps are not disclosed in detail, as these should be well-known to those skilled in the art. Other embodiments may be utilized and structural, logical, and electrical changes may be made without departing from the scope of the present invention.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

Figure 1B:
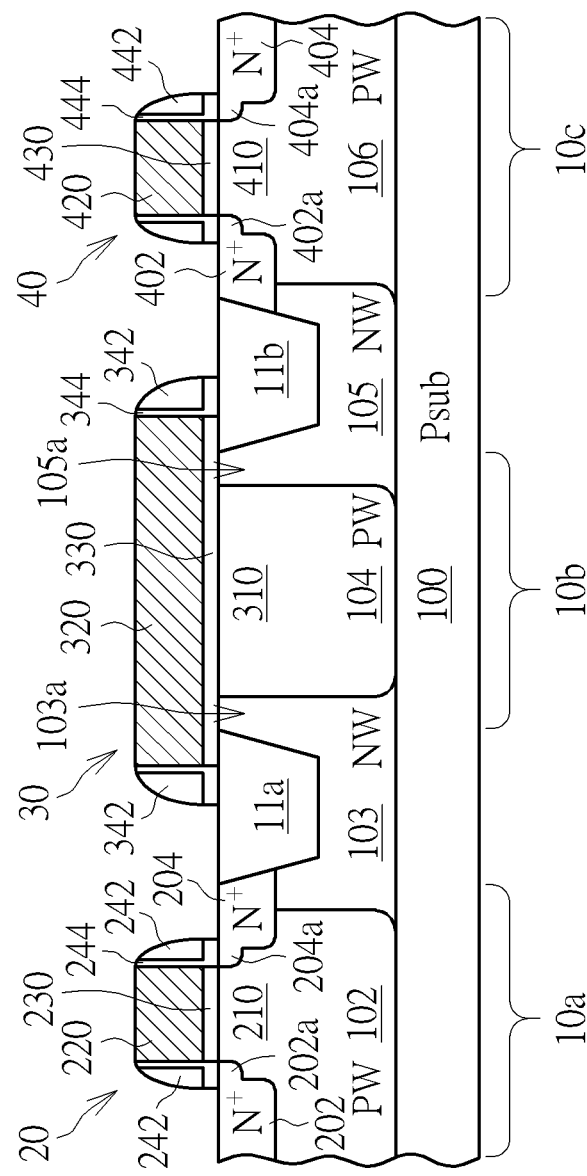
FIG. 1B is a schematic, cross-sectional diagram taken along line I-I' of FIG. 1A.
Figure 1C:
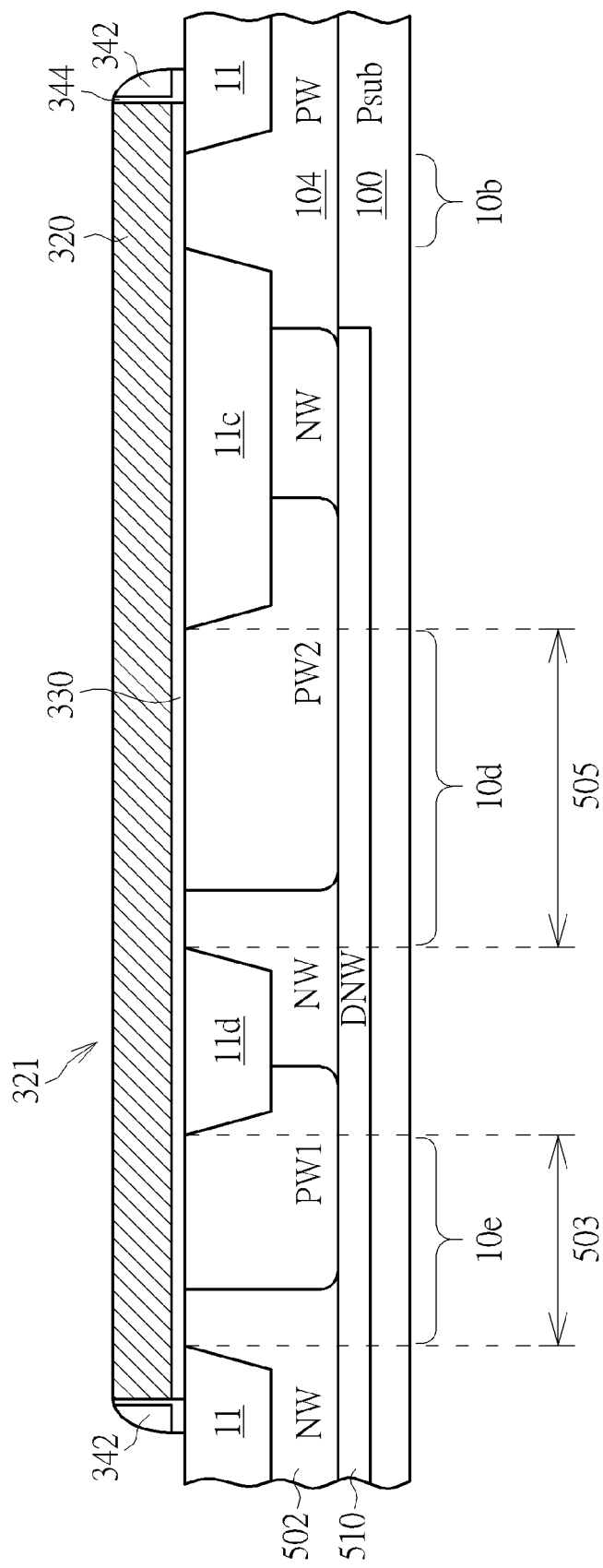
FIG. 1C is a schematic, cross-sectional diagram taken along line II-II' of FIG. 1A.

FIGS. 1A-1C are schematic diagrams demonstrating a single-poly, nonvolatile memory cell unit in accordance with one embodiment of this invention. The demonstrated nonvolatile memory cell unit may function as a multi-time programmable (MTP) memory unit. As shown in FIG. 1A, the nonvolatile memory cell unit 1 comprises three spaced-apart oxide define (OD) regions arranged and aligned in a row along the first direction (reference x axis). The three spaced-apart OD regions are first OD region 10a, second OD region 10b, and third OD region 10c, which are defined by an isolation region 11 embedded in a main surface of a semiconductor substrate 100 such as a P type doped silicon substrate. The second OD region 10b is situated between the first OD region 10a and third OD region 10c. According to the embodiment, the isolation region 11 may be a shallow trench isolation (STI) region, but should not be limited thereto. According to the embodiment, the isolation region 11 may be fabricated concurrently with the logic circuit elements such as PMOS or NMOS transistors in the logic circuits. However, it is to be understood that the isolation region 11 can be fabricated separately from the logic circuit elements in some cases. As shown in FIG. 1A and FIG. 1B, according to the embodiment, the isolation region 11 includes a first intervening isolation region 11a, which is interposed between the first OD region 10a and the second OD region 10b, and a second intervening isolation region 11b, which is interposed between the second OD region 10b and the third OD region 10c.

A select transistor 20 may be formed directly on the first OD region 10a. According to the embodiment, the select transistor 20 is an NMOS transistor and comprises a source doping region 202 (coupled to a source line SL) in a P type region 102, a drain doping region 204 spaced apart from the source doping region 202, a channel region 210 near the main surface of the semiconductor substrate 100 between the source doping region 202 and the drain doping region 204, a select gate (SG) 220 overlying the channel region 210, and a gate dielectric layer 230 between the select gate 220 and the channel region 210. A sidewall spacer 242 such as silicon nitride spacers may be provided on the sidewall of the select gate 220. A liner layer 244 such as silicon oxide liner may be interposed between the sidewall spacer 242 and the sidewall of the select gate 220. Further, lightly doped drain (LDD) regions 202a and 204a may be provided in the P type region 102 and may be situated directly under the sidewall spacers 242. As can be best seen in FIG. 1A, the straight line-shaped select gate extends along the second direction (reference y axis).

Still referring to FIG. 1A and FIG. 1B, a floating gate transistor 30 is formed directly on the second OD region 10b. The floating gate transistor 30 is coupled to the select transistor 20 through the drain doping region 204. That is, the drain doping region 204 is commonly shared by the floating gate transistor 30 and the select transistor 20, thereby forming two serially connected transistors, and in this case, two serially connected NMOS transistors. The floating gate transistor 30 comprises a floating gate (FG) 320 overlying the second OD region 10b. A sidewall spacer 342 and a liner layer 344 may be provided on the sidewall of the floating gate (FG) 320. It is one feature of the invention that the sidewall of the floating gate 320 and the sidewall spacer 342 are directly situated above the isolation region 11, and the sidewall and the sidewall spacer 342 do not overlapped with the any of OD regions when viewed from the above. In other words, an entire perimeter of the floating gate is located directly on the isolation region. By doing this, the data retention loss or current leakage from the floating gate 320 can be greatly reduced.

A second select transistor 40 for programming operation is provided directly on the third OD region 10c. The second select transistor 40 may be an NMOS transistor and comprises a source doping region 402 in a P type region 106, a drain doping region 404 (coupled to a bit line BL) spaced apart from the source doping region 402, a channel region 410 near the main surface of the semiconductor substrate 100 between the source doping region 402 and the drain doping region 404, a gate 420 overlying the channel region 410, and a gate dielectric layer 430 between the select gate 420 and the channel region 410. A pair of sidewall spacers 442 such as silicon nitride spacers may be provided on opposite sidewalls of the gate 420. A liner layer 444 such as silicon oxide liner may be interposed between the sidewall spacer 442 and the sidewall of the gate 420. Further, LDD regions 402a and 404a may be provided in the P type region 106 and may be situated directly under the sidewall spacers 442. The straight line-shaped gate 420 extends along the second direction (reference y axis). The transistor 40 is serially connected to the floating gate transistor 30 through the source doping region 402, thereby forming three serially connected transistors 20, 30 and 40 in a row.

As shown in FIG. 1B, a first N type region 103 is formed in the semiconductor substrate 100. The first N type region 103 encompasses the first intervening isolation region 11a. The floating gate transistor 30 is coupled to the drain doping region 204 of the select transistor 20 through the first N type region 103 that partially overlaps with the floating gate 320 in the second OD region 10b and partially overlaps with the drain doping region 204 in the first OD region 10a. The overlapping region between the first N type region 103 and the floating gate 320 is denoted as region 103a. Likewise, a second N type region 105 is formed in the semiconductor substrate 100 to encompass the second intervening isolation region 11b. The floating gate transistor 30 is coupled to drain doping region 402 in the third OD region 10c through the second N type region 105 that partially overlaps with the floating gate 320 in the second OD region 10b and partially overlaps with the drain doping region 402 in the third OD region 10c. The overlapping region between the second N type region 105 and the floating gate 320 is denoted as region 105a. A P type region or P well (PW) 104 is provided between the overlapping regions 103a and 105a and is directly under the floating gate 320. A floating gate channel 310 may be defined between the overlapping regions 103a and 105a in the P type region 104. A floating gate dielectric layer 330 is provided between the major surface of the semiconductor substrate 100 and the floating gate 320. The overlapping regions 103a and 105a are source/drain regions of the floating gate transistor 30, which may be an N/P type well like structure, and may be formed in the stage of well implantation process prior to the formation of the floating gate 320.

As shown in FIG. 1A and FIG. 1C, the memory cell unit 1 may also comprise the fourth OD region 10d, and the fifth OD region 10e. The second OD region 10b, the fourth OD region 10d, and the fifth OD region 10e may be arranged in a column along the second direction (reference y axis). According to the embodiment, the isolation region 11 further includes a third intervening isolation region 11c between the second OD region 10b and the fourth OD region 10d, and a fourth intervening isolation region 11d between the fourth OD region 10d and the fifth OD region 10e.

The floating gate 320 includes an extended portion 321 that extends along the second direction to completely overlap with the underlying fourth OD region 10d, and the fifth OD region 10e, such that the sidewall and the sidewall spacer 342 do not overlap with the any of OD regions when viewed from the above. The extended portion 321 of the floating gate 320 is capacitively coupled with a coupling gate region 505 comprising a P type region PW2, and an erase gate region 503 which is defined by the fifth OD region 10e comprising a P type region PW1. The P type region PW2 partially overlaps with the fourth OD region 10d. The P type region PW1 partially overlaps with the fifth OD region 10e. The fourth OD region 10d and the fifth OD region 10e both partially overlap with an N well 502 that is contiguous with PW1 and PW2. The fourth OD region 10d, the fifth OD region 10e, the erase gate region 503, and the coupling gate region 505 may be formed within a deep N well 510 or may be formed directly above an N type buried layer (NBL) region. The function of the deep N well 510 is to isolate the semiconductor substrate 100 from the P type regions PW1 and PW2. According to the embodiment, the coupling gate region 505 may have a surface area that is greater than the surface area of the erase gate region 503.

In another embodiment, the position of the erase gate region 503 and the position of the coupling gate region 505 may be interchangeable. For example, the erase gate region 503 may be within the fourth OD region 10d, while the coupling gate region 505 may be within the fifth OD region 10e. Furthermore, the erase gate region 503 and the coupling gate region 505 may be formed in different and separate deep N wells in other embodiments. Likewise, the fourth OD region 10d and the fifth OD region 10e may be encompassed by two separate, space-apart deep N wells. There can be more than two coupling gates, erase gates, and deep N wells under the extended floating gate portion in other embodiments.

By way of example, the floating gate 320 may have a rectangular shape and may have four straight side edges 320a, 320b, 320c, and 320d. It is to be understood that the shape of the floating gate is only for illustration purposes. The sidewall spacer 342 and liner layer 344 may be formed along the four straight side edges 320a, 320b, 320c, and 320d. According to the embodiment, the floating gate 320 is completely overlapped with the underlying second OD region 10b, the fourth OD region 10d, and the fifth OD region 10e, and is partially overlapped with the first and second intervening isolation regions 11a and 11b. The side edges and the sidewall spacer 342 do not overlapped with the any of OD regions when viewed from the above. For example, the two opposite side edges 320a and 320b of the floating gate 320 are situated directly on the first and second intervening isolation regions 11a and 11b, respectively. The dimensions of the overlapping regions between the floating gate 320 and the first and second intervening isolation regions 11a and 11b are adjustable and may be optimized.

Figure 2A:
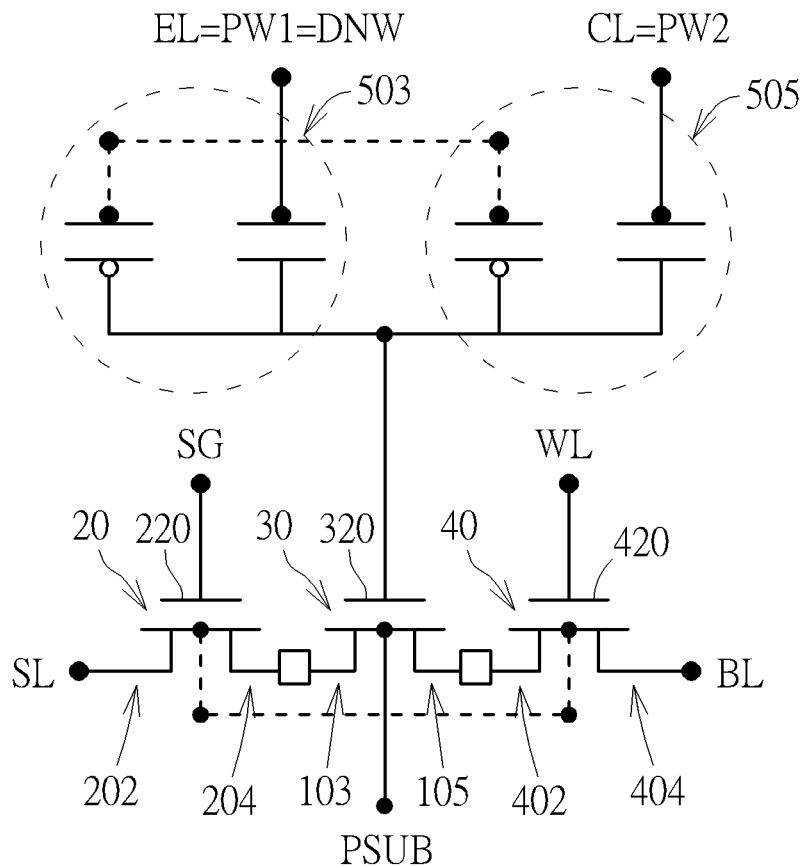

FIGS. 2A and 2B illustrate the equivalent circuit and exemplary operation conditions for programming (PGM), reading (READ) or erasing (ERS) operations of the memory cell unit as set forth in FIG. 1A. As shown in FIGS. 2A and 2B, during PGM operation, the substrate (PSub) 100, the select gate (SG) 220, the source line (SL) coupled to the source doping region 202, and the bit line (BL) coupled to the drain doping region 404 are provided with a ground voltage VSS. The word line (WL) 420 is provided with a voltage source VDD. The control line (CL) coupled to the P type region PW2 and the erase line (EL) coupled to the P type region PW1 and DNW are both provided with a second voltage source VPP.

During ERS operation, the substrate (PSub) 100, the select gate (SG) 220, the source line (SL) coupled to the source doping region 202, and the bit line (BL) coupled to the drain doping region 404 are provided with the ground voltage VSS. The word line (WL) 420 is provided with the voltage source VDD. The control line (CL) coupled to the P type region PW2 is provided with the ground voltage VSS. The erase line (EL) coupled to the P type region PW1 and DNW is provided with a second voltage source VPP.

During READ operation, the substrate (PSub) 100 and the source line (SL) coupled to the source doping region 202 are provided with the ground voltage VSS. The bit line (BL) coupled to the drain doping region 404 is provided with a bit line voltage VBL. The select gate 220 and the word line (WL) 420 are provided with the voltage source VDD. The control line (CL) coupled to the P type region PW2 and the erase line (EL) coupled to the P type region PW1 and DNW are both provided with a read voltage VRD.

FIG. 2B illustrates the bias conditions of the memory cell unit as set forth in FIG. 1A. It is to be noted that the magnitude of the second voltage source VPP is higher than the magnitude of the voltage source VDD, the bit line voltage VBL and the read voltage VRD.

The data access path includes two select transistors (20/40) that act as a charge sensing transistor, which is electrically connected to the floating gate 320 one side thought the N/P type well-like resistance (103/105) or LDMOS (Laterally Diffused Metal Oxide Semiconductor) structure.

Figure 3A:
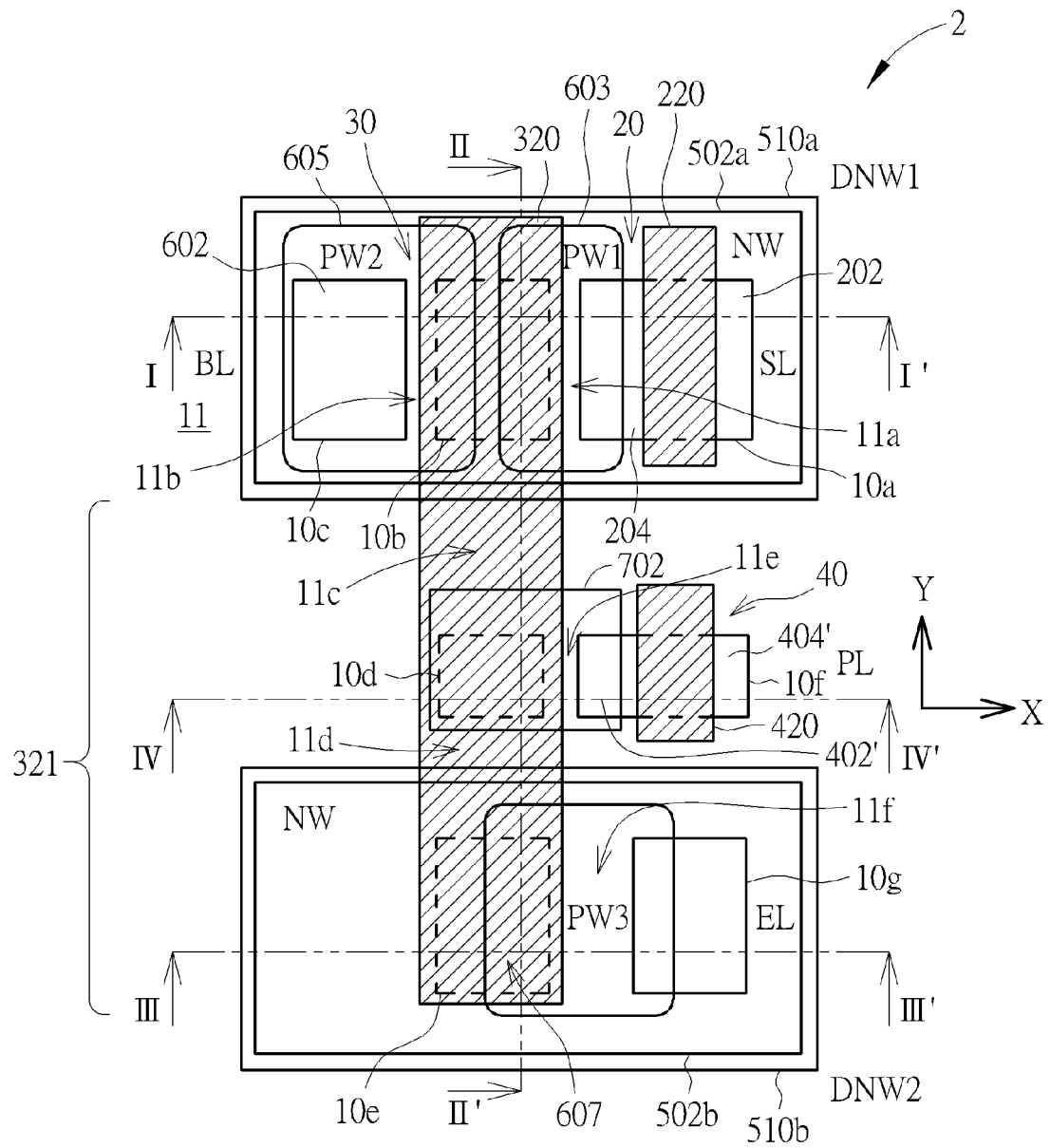

FIGS. 3A-3E are schematic diagrams demonstrating a single-poly, nonvolatile memory cell unit in various cross-sectional views in accordance with another embodiment of this invention, wherein like numeral numbers designate like elements, layers or regions. The demonstrated nonvolatile memory cell unit may function as an MTP memory unit. As shown in FIG. 3A, likewise, the nonvolatile memory cell unit 2 comprises three spaced-apart oxide define (OD) regions arranged and aligned in a row along the first direction (reference x axis). The three spaced-apart OD regions are first OD region 10a, second OD region 10b, and third OD region 10c, which are defined by an isolation region 11 embedded in a main surface of a semiconductor substrate 100 such as a P type doped silicon substrate. The second OD region 10b is situated between the first OD region 10a and third OD region 10c. According to the embodiment, the isolation region 11 may be a shallow trench isolation region, but should not be limited thereto. According to the embodiment, the isolation region 11 may be fabricated concurrently with the logic circuit elements such as PMOS or NMOS transistors in the logic circuits. However, it is to be understood that the isolation region 11 can be fabricated separately from the logic circuit elements in some cases.

Figure 3B:
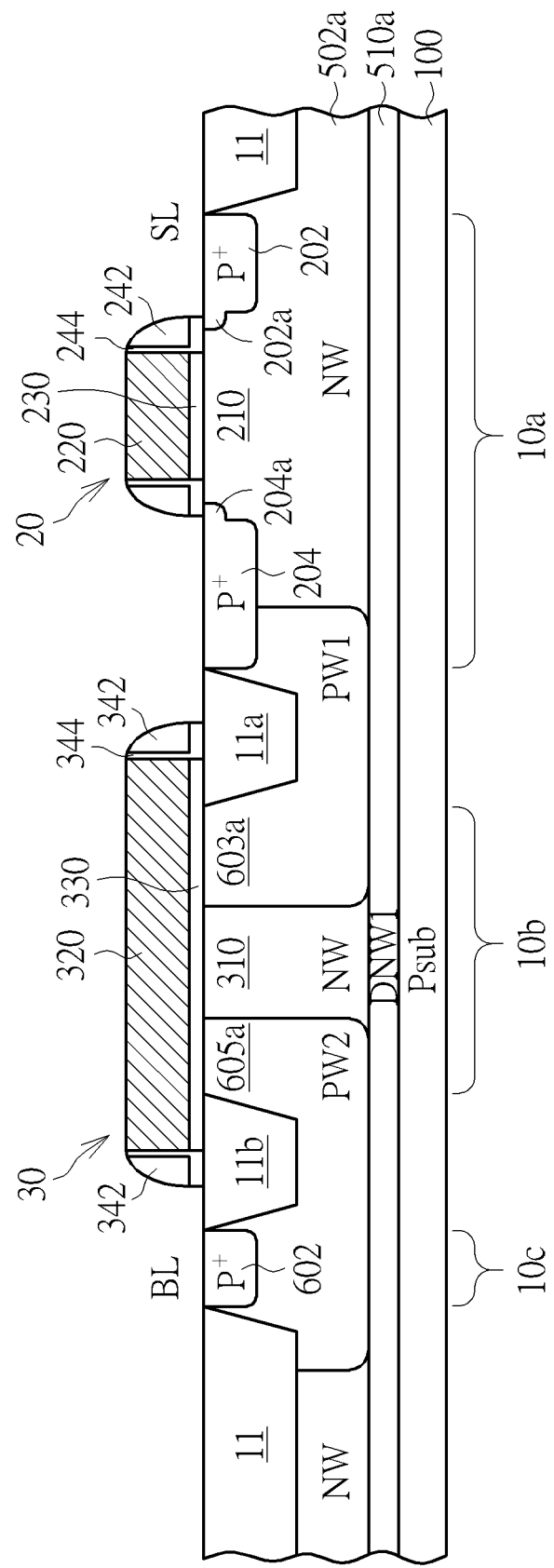
Figure 3C:
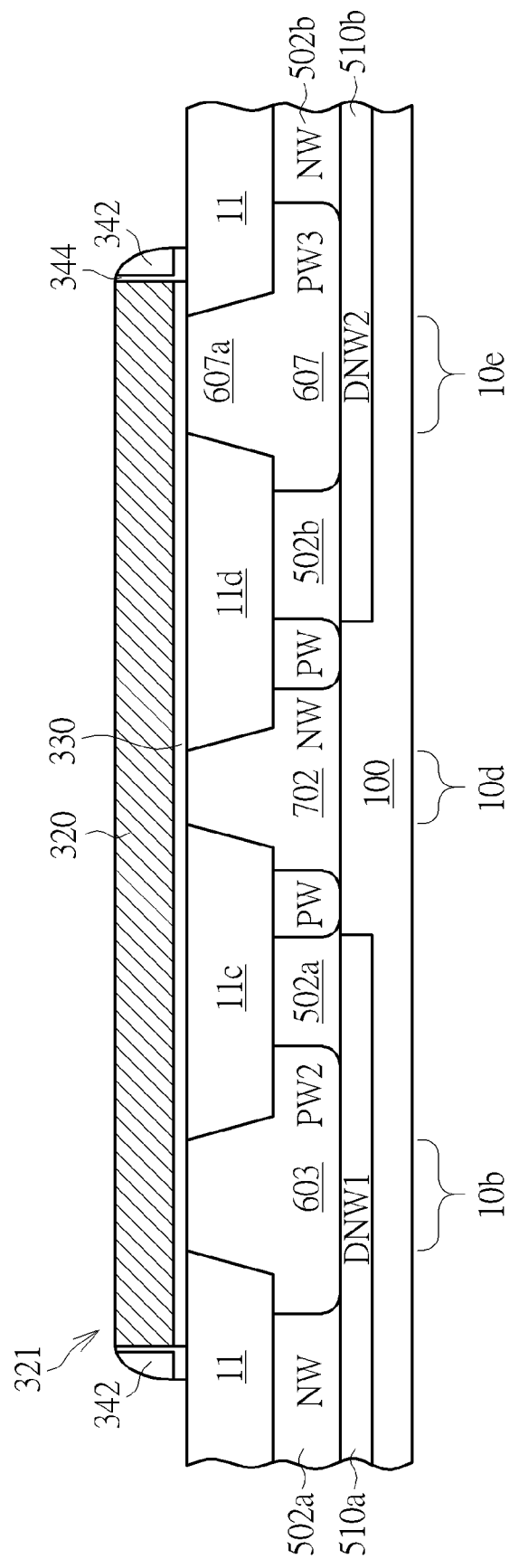
Figure 3D:
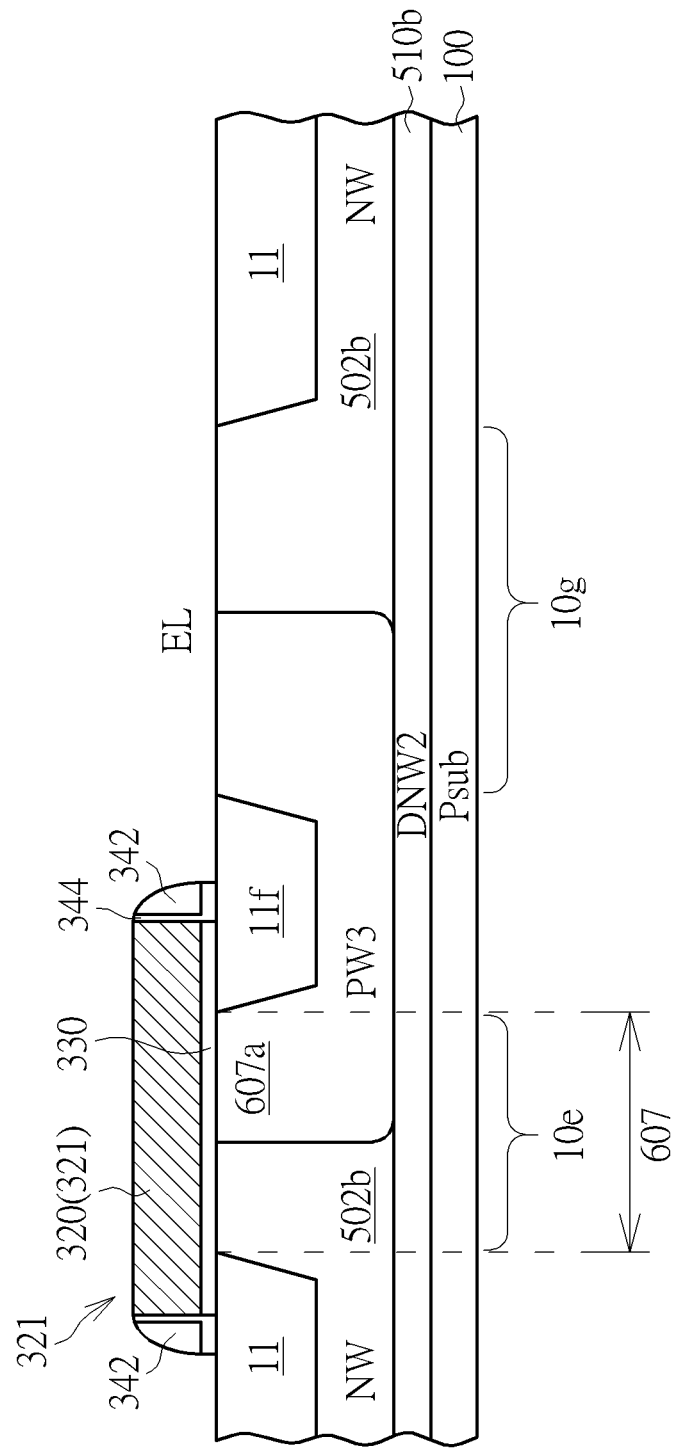

As shown in FIG. 3A and FIG. 3B, according to the embodiment, the isolation region 11 includes a first intervening isolation region 11a interposed between the first OD region 10a and the second OD region 10b, and a second intervening isolation region 11b interposed between the second OD region 10b and the third OD region 10c. The first OD region 10a, the second OD region 10b, and the third OD region 10c may be located within an N type region (NW) 502a. A deep N well 510a may be provided in the semiconductor substrate 100 under the N type region 502a.

A select transistor 20 may be formed directly on the first OD region 10a. According to the embodiment, the select transistor 20 may be a PMOS transistor and comprises a source doping region 202 (coupled to a source line SL), a drain doping region 204 spaced apart from the source doping region 202, a channel region 210 between the source doping region 202 and the drain doping region 204, a select gate 220 overlying the channel region 210, and a gate dielectric layer 230 between the select gate 220 and the channel region 210. A sidewall spacer 242 such as silicon nitride spacers may be provided on the sidewall of the select gate 220. A liner layer 244 such as silicon oxide liner may be interposed between the sidewall spacer 242 and the sidewall of the select gate 220. Further, LDD regions 202a and 204a may be provided in the N type region 502a and may be situated directly under the sidewall spacers 242.

Still referring to FIG. 3A and FIG. 3B, a floating gate transistor 30 is formed directly on the second OD region 10b. The floating gate transistor 30 is coupled to the select transistor 20 through the drain doping region 204. That is, the drain doping region 204 is commonly shared by the floating gate transistor 30 and the select transistor 20, thereby forming two serially connected transistors, and in this case, two serially connected PMOS transistors. The floating gate transistor 30 comprises a floating gate 320 overlying the second OD region 10b. A sidewall spacer 342 and a liner layer 344 may be provided on the sidewall of the floating gate 320. It is one feature of the invention that the sidewall of the floating gate 320 and the sidewall spacer 342 are directly situated above the isolation region 11, and the sidewall and the sidewall spacer 342 do not overlapped with the any of OD regions when viewed from the above. In other words, an entire perimeter of the floating gate is located directly on the isolation region. By doing this, the data retention loss or current leakage from the floating gate 320 can be greatly reduced. In the third OD region 10c, a bit line contact doping region 602 such as a P+ doping region is provided. The bit line contact doping region 602 is electrically connected to a bit line (BL).

As shown in FIG. 3B, a first P type region PW1 is formed in the deep N well 510a. The first P type region PW1 encompasses the first intervening isolation region 11a. The floating gate transistor 30 is coupled to the drain doping region 204 of the select transistor 20 through the first P type region PW1 that partially overlaps with the floating gate 320 in the second OD region 10b and partially overlaps with the drain doping region 204 in the first OD region 10a. The overlapping region between the first P type region PW1 and the floating gate 320 is denoted as region 603a. Likewise, a second P type region PW2 is formed in the deep N well 510a to encompass the second intervening isolation region 11b and the third OD region 10c. The floating gate transistor 30 is coupled to the bit line contact doping region 602 in the third OD region 10c through the second P type region PW2. The second P type region PW2 partially overlaps with the floating gate 320 in the second OD region 10b and overlaps with the bit line contact doping region 602 in the third OD region 10c. The overlapping region between the second P type region PW2 and the floating gate 320 is denoted as region 605a. A floating gate channel 310 may be defined between the overlapping regions 603a and 605a. A floating gate dielectric layer 330 is provided under the floating gate 320. The overlapping regions 603a and 605a are source/drain regions of the floating gate transistor 30, which may be an N/P type well like structure, and may be formed in the stage of well implantation process prior to the formation of the floating gate 320.

The memory cell unit 2 may also comprise the fourth OD region 10d, and the fifth OD region 10e. The second OD region lob, the fourth OD region 10d, and the fifth OD region 10e may be arranged in a column along the second direction (reference y axis). According to the embodiment, the isolation region 11 may further include a third intervening isolation region 11c between the second OD region 10b and the fourth OD region 10d, and a fourth intervening isolation region 11d between the fourth OD region 10d and the fifth OD region 10e. A sixth OD region 10f is juxtaposed to and in close proximity to the fourth OD region 10d. A seventh OD region log is juxtaposed to and in close proximity to the fifth OD region 10e. According to the embodiment, the isolation region 11 may further include a fifth intervening isolation region 11e between the fourth OD region 10d and the sixth OD region 10f, and a sixth intervening isolation region 11f between the fifth OD region 10e and the seventh OD region 10g.

Likewise, the floating gate 320 may include an extended portion 321 that extends along the second direction to completely overlap with the underlying fourth OD region 10d and the fifth OD region 10e, such that the sidewall and the sidewall spacer 342 are not overlapped with the any of the OD regions when viewed from the above. The extended portion 321 of the floating gate 320 is capacitively coupled with an erase gate region 607 comprising a P type region PW3. The P type region PW3 is disposed within an N type region (NW) 502b. A deep N well 510b may be provided in the semiconductor substrate 100 under the N type region 502b. The deep N well 510b is spaced apart from the deep N well 510a. The P type region PW3 partially overlaps with the fifth OD region 10e and the seventh OD region 10g, and the P type region PW3 encompasses the sixth intervening isolation region 11f. The overlapping region between the extended portion 321 of the floating gate 320 and the P type region PW3 is denoted as 607a. The seventh OD region log is coupled to an erase line (EL).

Figure 3E:
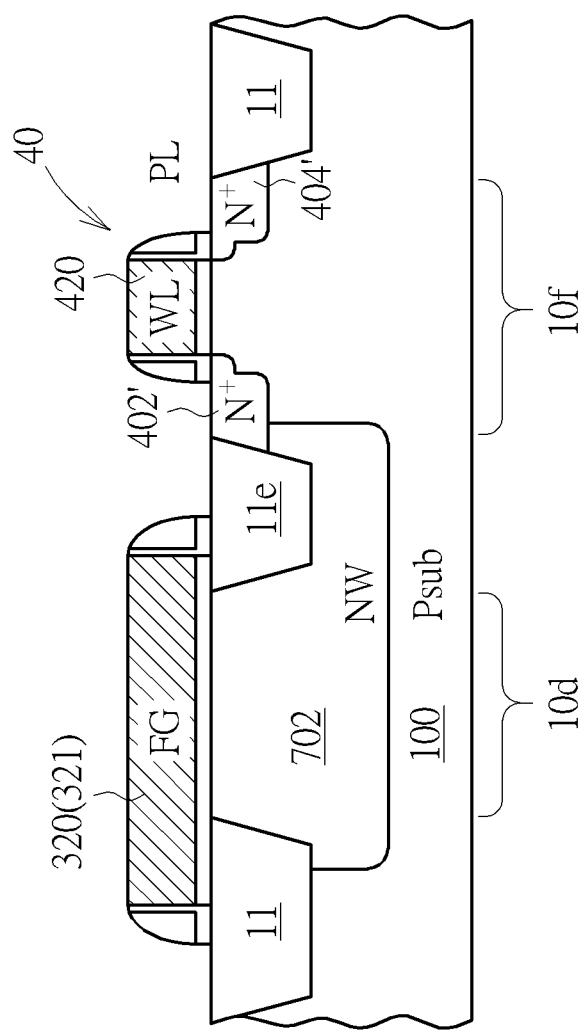

Referring to FIG. 3E, and also FIG. 3A briefly, a second select transistor 40 for programming operation is provided directly on the six OD region 10f. The second select transistor 40 may be an NMOS transistor and comprises a drain doping region 402' in the substrate 100, a source doping region 404' (coupled to a program line PL) spaced apart from the drain doping region 402', a channel region near the main surface of the semiconductor substrate 100 between the drain doping region 402' and the source doping region 404', and a second select gate (coupled to a word line) 420 overlying the channel region. The straight line-shaped gate 420 extends along the second direction (i.e. the reference y axis in FIG. 3A). The second select transistor 40 is coupled to the floating gate transistor 30 through the drain doping region 402' and the N well 702 that partially overlaps with the drain doping region 402'. As shown in FIG. 3E, the drain doping region 402' is coupled to the N well 702.

As shown in FIG. 3A, briefly, the nonvolatile memory cell unit 2 has a three-row configuration with the first, second and third OD regions (including floating gate transistor 30 and select transistor 20) in the first row for reading operation, the fourth and sixth OD regions (including the transistor 40) in the second row for program operation, and the fifth and seventh OD regions in the third row for erase operation.

Figure 4A:
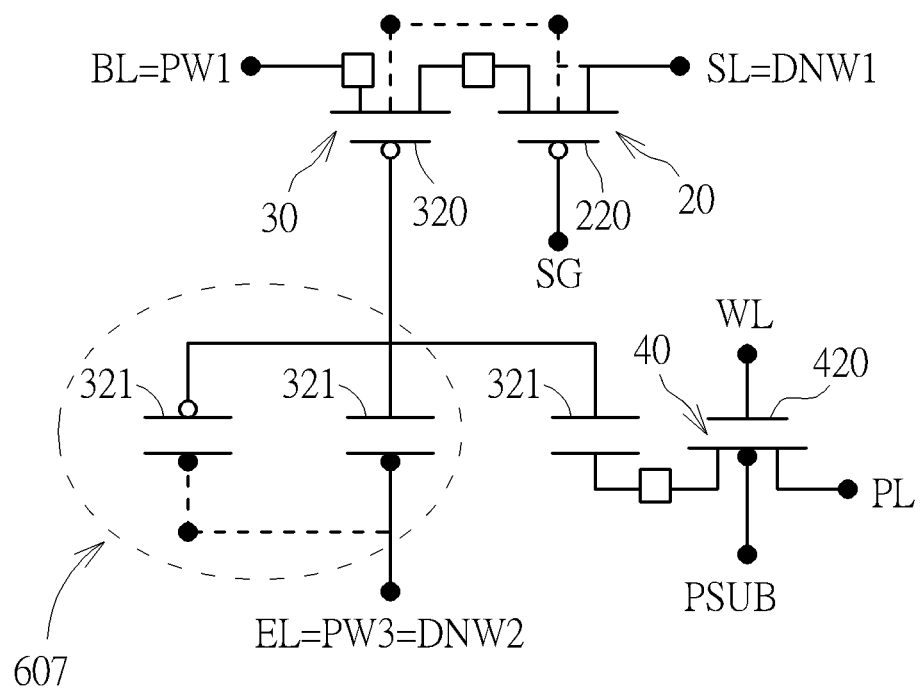

FIGS. 4A and 4B illustrate the equivalent circuit and exemplary operation conditions for programming (PGM), reading (READ) or erasing (ERS) operations of the memory cell unit as set forth in FIG. 3A. As shown in FIGS. 4A and 4B, during PGM operation, the substrate (PSub) 100 and the program line (PL) are coupled to a ground voltage VSS. The source line (SL) and the erase line (EL) are coupled to a second voltage source VPP. The bit line (BL) is floating. The select gate (SG) 220 and the word line (WL) 420 are provided with a voltage source VDD.

During ERS operation, the word line (WL) 420 is provided with the voltage source VDD. The erase line (EL) is provided with the second voltage source VPP. The other terminals are coupled to the ground voltage VSS.

During READ operation, the word line (WL) 420 is provided with the voltage source VDD. The erase line (EL) and the program line (PL) are provided with a read voltage VRD. The bit line (BL) is provided with a bit line voltage VBL. The other terminals are coupled to the ground voltage VSS.

FIG. 4B illustrates the bias conditions of the memory cell unit as set forth in FIG. 3A. It is to be noted that the magnitude of the second voltage source VPP is higher than the magnitude of the voltage source VDD, the bit line voltage VBL and the read voltage VRD.

The data access path includes the select transistor 20 that acts as a charge sensing transistor, which is electrically connected to the floating gate 320 one side thought the N/P type well-like resistance (PW1) or LDMOS (Laterally Diffused Metal Oxide Semiconductor) structure. It is another feature of the invention that source/drain regions of the floating gate transistor, i.e., the overlapping regions (103a/105a or 605a/603a), may be N/P type well-like structure, and may be formed prior to the formation of the floating gate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A nonvolatile memory structure, comprising:
 a semiconductor substrate of a first conductivity type having thereon a first oxide define (OD) region, a second OD region and a third OD region arranged in a row along a first direction, wherein the first, second, and third OD regions are separated from one another by an isolation region, and wherein the isolation region comprises a first intervening isolation region between the first OD region and the second OD region, and a second intervening isolation region between the second OD region and the third OD region;
 a first select transistor on the first OD region, wherein the first select transistor comprises a select gate extending along a second direction;
 a floating gate transistor on the second OD region, wherein the floating gate transistor is serially coupled to the first select transistor, and wherein the floating gate transistor comprises a floating gate that is completely overlapped with the underlying second OD region and is partially overlapped with the first and second intervening isolation regions, wherein an entire perimeter of the floating gate is located directly on the isolation region; and
 a second select transistor on the third OD region serially coupled to the floating gate transistor, wherein the second select transistor comprises a word line extending along the second direction.

2. The nonvolatile memory structure according to claim 1 wherein the first select transistor further comprises a source doping region of a second conductivity type coupled to a source line, an drain doping region of the second conductivity type spaced apart from the source doping region, a channel region between the source doping region and the drain doping region, the select gate overlying the channel region, and a gate dielectric layer between the select gate and the channel region, and the floating gate transistor is serially coupled to the first select transistor through the drain doping region.

3. The nonvolatile memory structure according to claim 1 wherein the first direction is substantially perpendicular to the second direction.

4. The nonvolatile memory structure according to claim 2 wherein a first well of the second conductivity type encompassing the first intervening isolation region and a second well of the second conductivity type encompassing the second intervening isolation region are provided in the semiconductor substrate, and the floating gate transistor is coupled to the drain doping region of the first select transistor through the first well that partially overlaps with the floating gate in the second OD region and partially overlaps with the drain doping region in the first OD region.

5. The nonvolatile memory structure according to claim 4 wherein the floating gate transistor is coupled to a source doping region of the second select transistor in the third OD region through the second well that partially overlaps with the floating gate in the second OD region and partially overlaps with the source doping region in the third OD region.

6. The nonvolatile memory structure according to claim 5 wherein the first well of the second conductivity type and the second well of the second conductivity type act as source/drain regions of the floating gate transistor.

7. The nonvolatile memory structure according to claim 6 wherein the first well and second well are both well-like structures and are formed prior to the formation of the floating gate.

8. The nonvolatile memory structure according to claim 5 wherein the second select transistor further comprise a drain doping region that is coupled to a bit line.

9. The nonvolatile memory structure according to claim 1 further comprising: a fourth OD region and a fifth OD region, wherein the second OD region, the fourth OD region, and the fifth OD region are arranged in a column along the second direction; and an extended portion of the floating gate that completely overlaps with the fourth OD region and the fifth OD region.

10. The nonvolatile memory structure according to claim 9 wherein the extended portion of the floating gate is capacitively coupled to a coupling gate region that overlaps with the fourth OD region and an erase gate region that overlaps with the fifth OD region.

11. The nonvolatile memory structure according to claim 9 wherein the fourth OD region and the fifth OD region are encompassed by one single ion well region having a conductivity type that is opposite to that of the semiconductor substrate.

12. The nonvolatile memory structure according to claim 9 wherein the fourth OD region and the fifth OD region are encompassed by two separate, space-apart ion well regions respectively, wherein the two separate, space-apart ion well regions both have a conductivity type that is opposite to that of the semiconductor substrate.

13. The nonvolatile memory structure according to claim 10 wherein the coupling gate region is defined by the fourth OD region which partially overlaps with a third well of the first conductivity type and a fifth well of the second conductivity type and the erase gate region is defined by the fifth OD region which partially overlaps with a fourth well of the first conductivity type and the fifth well of the second conductivity type.

14. A nonvolatile memory structure, comprising:
a semiconductor substrate of a first conductivity type having thereon a first oxide define (OD) region, a second OD region, a third OD region, a fourth OD region and a fifth OD region, wherein the first OD region, the second OD region, and the third OD region are arranged in a row along a first direction, while the second OD region, the fourth OD region, and the fifth OD region are arranged in a column along a second direction, wherein the first, second, and third OD regions are separated from one another by an isolation region, and wherein the isolation region comprises a first intervening isolation region between the first OD region and the second OD region, a second intervening isolation region between the second OD region and the third OD region, a third intervening isolation region between the second OD region and the fourth OD region, and a fourth intervening isolation region between the fourth OD region and the fifth OD region;
a first select transistor on the first OD region, wherein the first select transistor comprises a select gate extending along the second direction;
a floating gate transistor on the second OD region, wherein the floating gate transistor is serially coupled to the first select transistor, and wherein the floating gate transistor comprises a floating gate that is completely overlapped with underlying second OD region, the fourth OD region, the fifth OD region, the third intervening isolation region, and the fourth intervening isolation region, and is partially overlapped with the first and second intervening isolation regions, wherein an entire perimeter of the floating gate is located directly on the isolation region;
a sixth OD region being juxtaposed to the fourth OD region, wherein the sixth OD region is not overlapped with the floating gate;
a second select transistor coupled to a word line on the sixth OD region; and
wherein the floating gate transistor further comprises a heavily doped region of the first conductivity type formed in the third OD region that is electrically coupled to a bit line.

15. The nonvolatile memory structure according to claim 14 wherein the first select transistor further comprises a source doping region of the first conductivity type coupled to a source line, an drain doping region of the first conductivity type spaced apart from the source doping region, a channel region between the source doping region and the drain doping region, the select gate overlying the channel region, and a gate dielectric layer between the select gate and the channel region, and the floating gate transistor is serially coupled to the first select transistor through the drain doping region.

16. The nonvolatile memory structure according to claim 14 wherein the second select transistor further comprises a source doping region of the second conductivity type coupled to a program line, an drain doping region of the second conductivity type coupled to a well of the second conductivity type which overlaps the fourth OD region, a channel region between the source doping region and the drain doping region, a second select gate overlying the channel region, and a gate dielectric layer between the select gate and the channel region.

17. The nonvolatile memory structure according to claim 15 further comprising: a seventh OD region being juxtaposed to the fifth OD region; and an erase gate region capacitively coupled to an extended portion of the floating gate.

18. The nonvolatile memory structure according to claim 17 wherein a first well of the first conductivity type encompassing the first intervening isolation region and a second well of the first conductivity type encompassing the second intervening isolation region are provided in the semiconductor substrate.

19. The nonvolatile memory structure according to claim 18 wherein the erase gate region is defined by the fifth OD region which partially overlaps with a third well of the first conductivity type and a fourth well of the second conductivity type.

20. The nonvolatile memory structure according to claim 19 wherein the erase gate region is coupled to an erase line through the third well of the first conductivity type which partially overlaps the seventh OD region.

21. The nonvolatile memory structure according to claim 14 wherein a source/drain region of the floating gate transistor comprises a well-like structure and are formed prior to the formation of the floating gate.

22. The nonvolatile memory structure according to claim 17 wherein the first OD region, the second OD region, and the third OD region are encompassed by a first ion well of the second conductivity type, and wherein the fifth OD region and the seventh OD region are within a second ion well of the second conductivity type.

23. A nonvolatile memory structure, comprising:
a semiconductor substrate of a first conductivity type having thereon a first oxide define (OD) region, a second OD region, a third OD region, a fourth OD region and a fifth OD region, wherein the first, second, and third OD regions are separated from one another by an isolation region, and wherein the isolation region comprises a first intervening isolation region between the first OD region and the second OD region, a second intervening isolation region between the second OD region and the third OD region, a third intervening isolation region between the second OD region and the fourth OD region, and a fourth intervening isolation region between the fourth OD region and the fifth OD region;

a floating gate transistor on the second OD region, comprising a floating gate completely overlapped with underlying the second OD region and well-like structures that function as source/drain of the floating gate transistor, and wherein the floating gate further comprises an extended portion that completely overlaps with the fourth OD region and the fifth OD region, wherein an entire perimeter of the floating gate is located directly on the isolation region;

a coupling gate region in the semiconductor substrate, wherein the coupling gate region overlaps with the fourth OD region and is capacitively coupled to the extended portion of the floating gate; and an erase gate region in the semiconductor substrate, wherein the erase gate region overlaps with the fifth OD region and is capacitively coupled to the extended portion of the floating gate; wherein an entire perimeter of the floating gate is located directly on the isolation region.

24. The nonvolatile memory structure according to claim 23 further comprising: a first select transistor on the first OD region, wherein the first select transistor comprises a select gate; wherein the floating gate transistor is serially coupled to the first select transistor.

25. The nonvolatile memory structure according to claim 24 further comprising: a sixth OD region being juxtaposed to the fourth OD region, wherein the sixth OD region is not overlapped with the floating gate; and a second select transistor coupled to a word line on the sixth OD region.

26. The nonvolatile memory structure according to claim 24 further comprising: a second select transistor serially coupled to the floating gate transistor on the third OD region, wherein the second select transistor comprises a second select gate.

\* \* \* \* \*